United States Patent [19]
Thrasher et al.

[11] Patent Number: 5,952,820
[45] Date of Patent: Sep. 14, 1999

[54] FOREIGN VOLTAGE DETECTOR

[76] Inventors: M. D. Thrasher, 30 Chestnut Cir., Warrior, Ala. 35180; Floyd Rohner, 316 Clinton Blvd., Clinton, Miss. 39056

[21] Appl. No.: 08/602,703

[22] Filed: Feb. 16, 1996

[51] Int. Cl.⁶ .................................................. G01R 19/22
[52] U.S. Cl. ........................................... 324/119; 324/133
[58] Field of Search ..................... 324/119, 117, 324/133, 126, 127, 72, 457, 458; 379/32, 21, 24, 26

[56] References Cited

U.S. PATENT DOCUMENTS

| | | | |
|---|---|---|---|
| 1,152,632 | 7/1915 | Hogan, Jr. | 324/119 |
| 1,799,683 | 4/1931 | Geiger | 324/119 |
| 1,836,934 | 12/1931 | Morecroft | 324/119 |
| 1,895,812 | 1/1933 | Morecroft | 324/119 |
| 2,140,016 | 12/1938 | Kautter | 324/119 |
| 2,615,969 | 10/1952 | Albrecht | 340/660 |
| 3,309,690 | 3/1967 | Moffitt | 324/72 |
| 3,482,235 | 12/1969 | Johnson | 324/72 |
| 3,786,468 | 1/1974 | Moffitt | 324/72 |
| 3,828,256 | 8/1974 | Liu | 324/72 |
| 4,123,009 | 10/1978 | Kilpinen | 241/30 |
| 4,349,783 | 9/1982 | Robson et al. | 324/133 |
| 4,613,228 | 9/1986 | Suzuki et al. | 324/457 |
| 4,716,371 | 12/1987 | Blitshteyn et al. | 324/457 |
| 4,724,393 | 2/1988 | Kumada et al. | 324/458 |
| 4,797,620 | 1/1989 | Williams | 324/458 |
| 4,804,922 | 2/1989 | Sometani et al. | 324/457 |
| 4,818,945 | 4/1989 | Bossard | 324/457 |
| 4,853,639 | 8/1989 | Vosteen et al. | 324/457 |
| 4,983,954 | 1/1991 | Huston | 324/457 |
| 5,001,465 | 3/1991 | Siegel | 324/72.5 |
| 5,315,255 | 5/1994 | Bittinger | 324/457 |
| 5,325,047 | 6/1994 | Kempton | 324/72 |
| 5,350,999 | 9/1994 | Brunda | 324/72 |
| 5,414,344 | 5/1995 | Chinn | 324/72 |
| 5,473,244 | 12/1995 | Libove et al. | 324/126 |
| 5,703,928 | 12/1997 | Galloway et al. | 379/21 |

Primary Examiner—Ernest Karlsen
Assistant Examiner—Russell M. Kobert
Attorney, Agent, or Firm—Womble Carlyle Sandridge & Rice

[57] ABSTRACT

A foreign voltage detector is provided to detect and warn of the presence of potentially dangerous voltage levels on conductors such as power cables, metal utility boxes, metal building frames, and the like. The detector comprises a capacitive leaf sensor that is charged through capacitive coupling when brought near a conductor. The charge is converted to a voltage signal that is low pass filtered and notch filtered to remove extraneous signals and telephone ringing signals. The filtered voltage signal is then converted to DC, and drives a ten element LED bar graph display to indicate the approximate level of voltage on the conductor. A buzzer is provided as an audible alarm of the presence of potentially dangerous voltage.

13 Claims, 3 Drawing Sheets

Fig_1

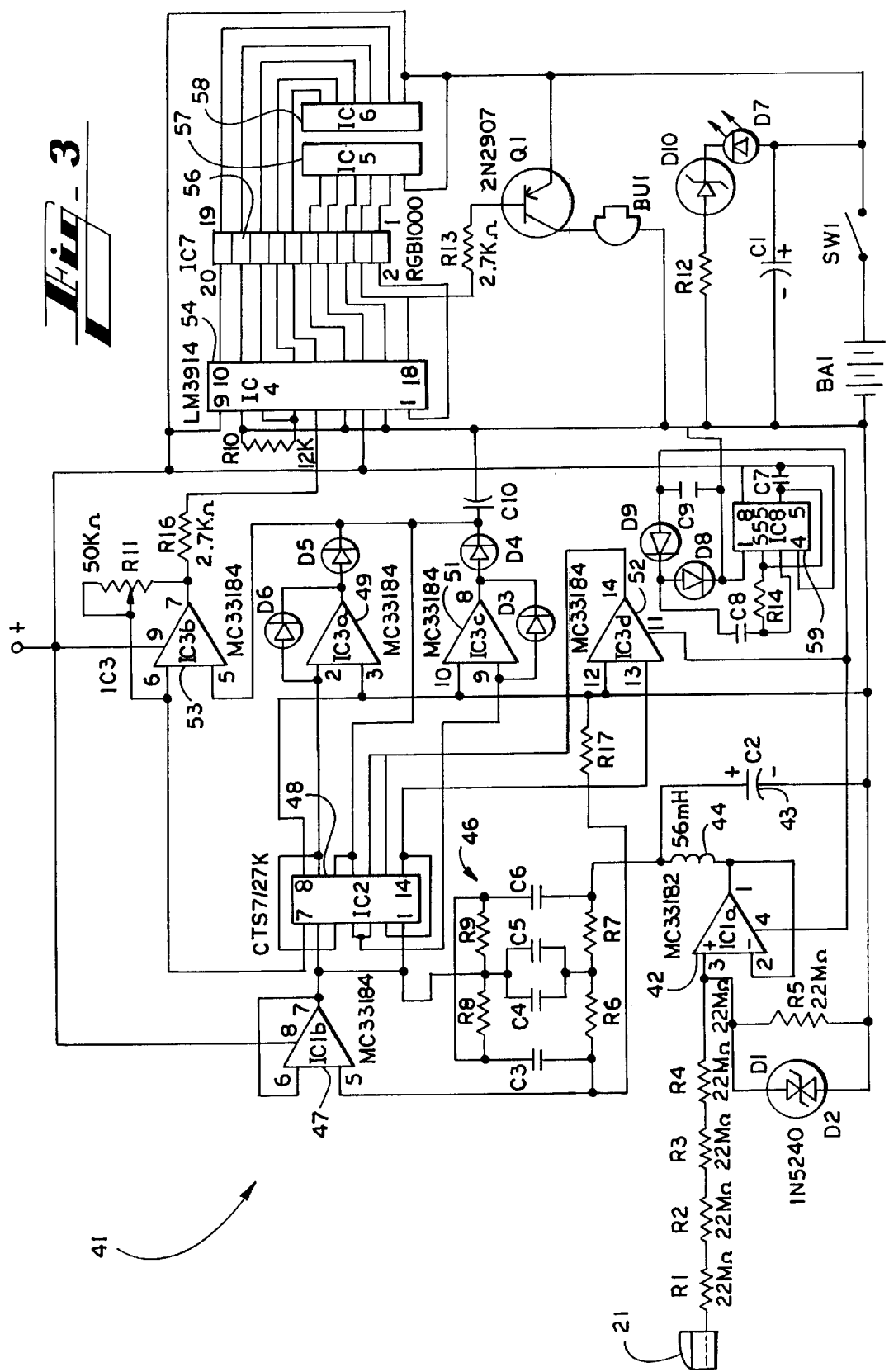

FOREIGN VOLTAGE DETECTOR

TECHNICAL FIELD

The present invention relates generally to voltage detection and more particularly to the detection by utility linemen, telephone system installers, and others of the presence of a potentially dangerous voltage on a conducting surface such as transmission lines, metal utility boxes, metal house trailers, and the like.

BACKGROUND OF THE INVENTION

Electrical utility workers, telephone linemen, appliance installation teams, and other types of workers often find themselves working among or near electrical conductors that could potentially carry large dangerous voltages. Electrical utility workers and telephone linemen, for example, often ply their trades near high voltage power lines. Even in situations where these individuals are not working directly in the vicinity of power lines, they nevertheless find themselves working on or with other metal items that can conduct potentially dangerous voltages under certain circumstances. These include electrical and telephone junction boxes, power distribution stations, circuit breaker panels, and even the metal exterior skin of house trailers and other metal buildings. It is extremely important that such workmen be able to determine whether these conductors and conducting surfaces carry potentially dangerous voltages before coming into contact with the conductor.

One method of determining whether a conductor is carrying a voltage is simply to measure the voltage directly with a volt meter connected between the conductor and ground. While this method indeed gives an accurate measurement of voltages present on the conductor, it is nevertheless dangerous and highly undesirable, particularly when measuring voltages greater than about 150 volts RMS. This is because direct contact is required between the volt meter probe and the conductor. Further, in many situations, such as with electrical power lines, the conductor is covered with an insulator so that direct contact with a volt meter probe is not practical.

Attempts to design voltage detectors that read the presence of a voltage on a conductor without actually contacting the conductor have been made. U.S. Pat. No. 5,414,344 of Chinn, for example, discloses a non-contact apparatus for sensing energization of high voltage signal lines. The device disclosed in this patent senses the presence of an electrical field with a metal antenna that can be varied in length to adjust the sensitivity of the device. The antenna is placed a distance from a suspected high voltage conductor, such as a power line, and, if a substantial E-field is detected, appropriate LED's can be lit to indicate that the monitored conductor is active. In addition, digital signals are produced so that breaker motors can be activated to engage or disengage a power line breaker upon the occurrence of certain criteria. While this device represents an improvement over direct contact measurements, it nevertheless has numerous inherent problems and shortcomings. For example, as disclosed in the specification of Chinn, this device is useful only for detecting very high voltage of approximately 2,000 volts and higher on power distribution lines. The device is not intended for use by workmen but rather is intended for permanent installation in a power substation for remotely monitoring electrical distribution lines and controlling substation relays. The Chinn device is not concerned with detecting relatively low voltages that might nevertheless be dangerous if contacted by a human. In addition, no filter means is provided for filtering out the presence of known but non-dangerous voltages that may be present on the conductor.

U.S. Pat. No. 5,325,047 of Kempton discloses a voltage monitoring apparatus for monitoring cathodic protection voltage on an underground pipeline. The device disclosed in this patent is a very simple analog device that requires direct connection to a conductor and to ground for purposes of measuring the presence of a protective voltage. Obviously, such direct connection is undesirable for use by electric utility workers and linemen.

Finally, U.S. Pat. No. 4,818,945 of Bossard discloses a non-contacting volt meter comprising a multi-layer capacitor that forms an arrangement of three coupled capacitors. This arrangement, according to Bossard, exhibits low time constants that permit detection of voltages in the megahertz range. Such detection is useful in electrostatic copying machines.

The devices of these patents fails to meet the needs of workers wishing to detect the presence of dangerous voltage potentials. Further, none of them suggests or even mentions an issue of particular interest to electric utility workers and telephone linemen; that is, the ability to detect potentially dangerous voltages on a conductor while ignoring the presence of known benign voltages. For example, potentially dangerous voltage signals usually are alternating current signals having a primary frequency of 60 hertz and harmonics up to about 180 hertz. Voltage signals above about 200 hertz are usually not dangerous but nevertheless can be induced in conductors by radio transmitter signals, microwave signals, and the like. These higher frequency signals are not potentially dangerous to the workmen but nevertheless can affect voltage detectors corrupting their measurements or producing a false alarm. Another benign signal commonly present among telephone circuits is the telephone ring signal. By far, the predominant ringing signal used in the United States telecommunications industry is a 20 hertz sine wave signal at about 85 to 105 volts RMS. While such a signal is common, it is nevertheless not considered dangerous by linemen and utility workers. However, detection of such a signal by a voltage detector could corrupt a measurement or indicate the presence of a dangerous condition when, in fact, no dangerous condition exists.

Accordingly, there exists a need for a method and apparatus for detecting and indicating to a worker the presence on electrical conductors of potentially dangerous voltage potentials. Such a method and apparatus should effectively filter out the presence of electrical signals having frequencies above about 200 hertz to filter out stray signals caused by, for example, transmitters. Furthermore, such a detector should accurately and effectively filter out signals produced at about 20 hertz that correspond to telephone ringing signals so that these signals will not corrupt measurements or produce a false alarm. Finally, such a method and apparatus should be configured in a small handheld device that can be carried by utility workers and linemen and should have a fully insulated probe that can be positioned adjacent suspected conductors without actually contacting the conductors to measure the presence of a voltage on the conductor. The apparatus should be convenient, reliable, accurate, and should be economical and feasible to produce in large quantities. It is to the provision of such a method and apparatus that the present invention is primarily directed.

SUMMARY OF THE INVENTION

The present invention, in one preferred embodiment thereof, comprises a portable hand-held device for use by electrical utility workmen, linemen, and the like, for detecting the presence of potentially dangerous voltages on a variety of metal conductors. The device comprises an insulated case that can be held in the hand and that terminates on one end in an insulated probe. Within the probe, a small conducting strip is bent in the form of a horseshoe to form one plate of a capacitor, the other plate being the conductor that is being measured. In use, the device is turned on and its probe is placed against a conductor to be tested. If an alternating voltage is present on the conductor, a corresponding charge will be induced through capacitive coupling on the horseshoe-shaped strip. This charge is then presented to the input of a unity gain operational amplifier configured as a voltage follower, which converts the sensed charge level on the plate to an analog voltage. This voltage is then passed through an LC low pass filter to remove any contributions to the signal from voltages with frequencies greater than about 200 hertz. This removes components of the signal that are induced by harmless sources such as radio transmissions, microwaves, and the like.

The resulting voltage signal is then presented to a precision twin-T notch filter with its notch frequency centered at 20 hertz. This filter removes from the remaining signal components that have a frequency of about 20 hertz. Thus, contributions that may be induced by telephone ringing signals are removed by the twin-T notch filter. After passing through the low pass and notch filters, the resulting signal comprises components having a frequency between 0 hertz and 200 hertz less any contributions from signals centered on 20 hertz.

The resulting signal is then passed to a precision full wave integrated circuit-based rectifier with a bridged capacitor on its output. This converts the filtered signal to a DC voltage having a magnitude proportional to the RMS magnitude of an AC voltage detected on the conductor. This DC voltage is then presented to the input of a scaling amplifier, the gain of which can be set by a variable resistor. The scaling amplifier is used to calibrate the device as necessary. From the output of the scaling amplifier, the signal is applied to the input of an LED bar graph driver, which is a commercially available integrated circuit. The driver is connected to an array of ten LED's arranged in a bar graph. The device is calibrated with the scaling amplifier so that each LED corresponds to a detected voltage on the conductor of 50 volts RMS. Thus, the LED bar graph scale represents a total of 500 volts RMS.

A buzzer is coupled through a transistor to the first LED of the bar graph. In this way, as soon as the minimum voltage of 50 volts RMS is detected on the conductor, the first LED of the bar graph lights and, simultaneously, an audible alarm sounds to alert a user to the presence of a potentially dangerous voltage.

In use, the insulated probe of the device of this invention is positioned against a conductor to be tested. If there is a potentially dangerous voltage on the conductor, the LED bar graph is lit to indicate the level of voltage present on the conductor. Since voltage components having non-commercial power frequencies above about 200 hertz and telephone ringing signals at 20 hertz have been removed, the user is assured that an indication shown on the LED bar graph is the result of a commercial power voltage that could be harmful if contacted. In cases where very high voltages are present, in the range of 1,000 volts and up, the device will actually light and alarm long before the probe is brought in contact with the conductor. In these situations, which can potentially be extremely dangerous, a user is alerted well in advance to stay clear of the conducting surface until the source of the voltage is detected and disconnected.

Thus, it is seen that an improved portable hand-held foreign voltage detector is now provided that is accurate, reliable, economical, and that responds only to voltage signals having frequencies corresponding to commercial power voltage standards. False alarms due to high frequency signals or telephone ringing signals are prevented so that an indicated voltage is limited to the types of voltages that originate with power sources and that can be dangerous or fatal if contacted. These and other objects, features, and advantages will become more apparent upon review of the detailed description set forth below when taken in conjunction with the accompanying drawings, a brief description of which follows.

BRIEF DESCRIPTION OF THE DRAWINGS

FIG. 3 is a detailed electronic schematic diagram illustrating a preferred embodiment of the electronic circuit comprising the present invention.

DETAILED DESCRIPTION OF THE PREFERRED EMBODIMENT

Figure 1:
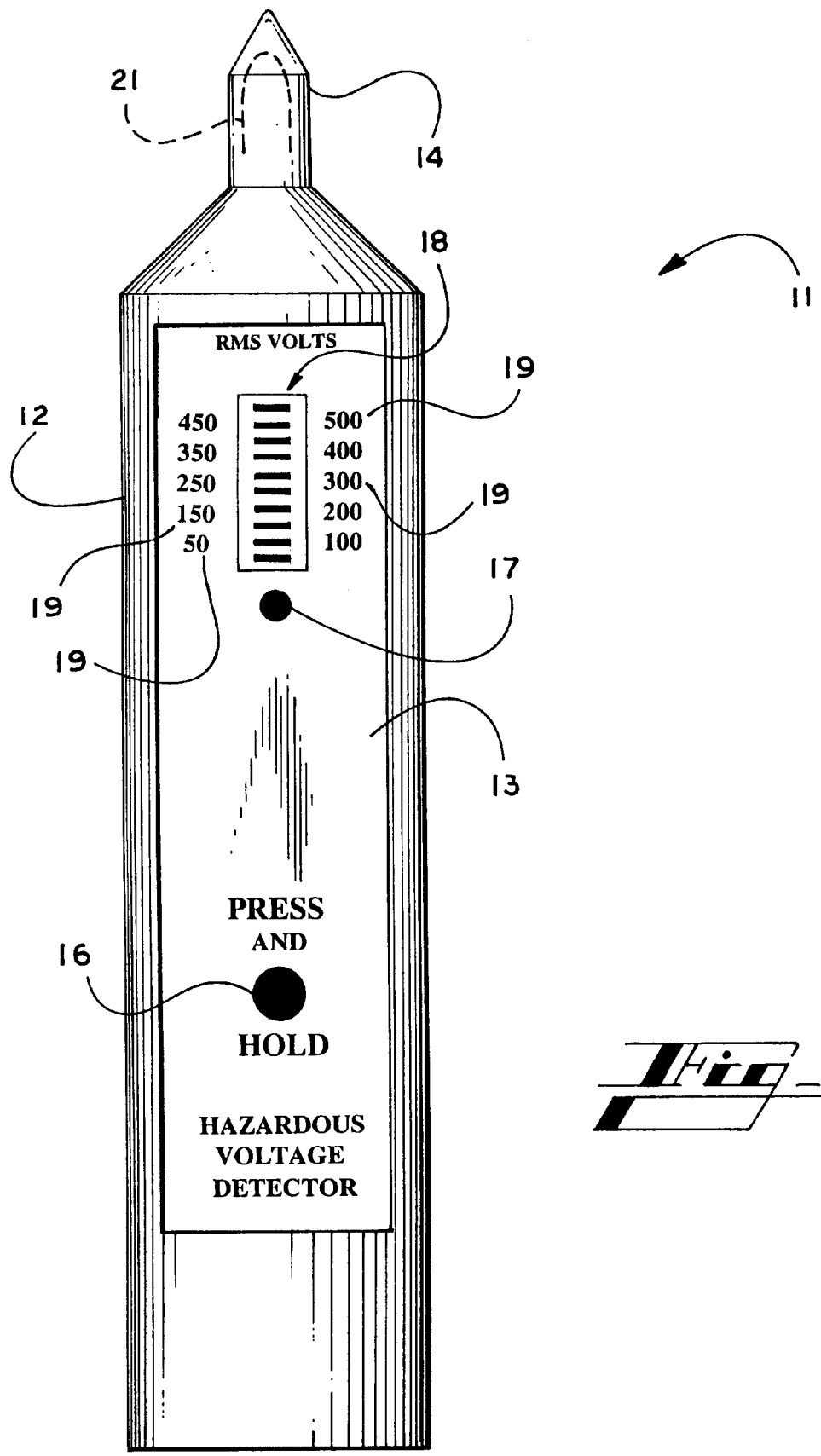
FIG. 1 is a front elevational view of a foreign voltage detector that embodies principles of the present invention in a preferred form.

Referring now in more detail to the drawings, in which like numerals refer to like parts throughout the several views, FIG. 1 illustrates the exterior appearance of a foreign voltage detector that embodies principles of this invention in a preferred form. The detector 11 comprises an insulated case 12 that is sized to fit in a user's hand and that is fully insulated against electrical conduction. Preferably, the case 12 is about the size of a television remote control and has a central body portion 13 that terminates in a probe tip 14 at its remote end. Accessible on the front panel of the case 12 is an activation switch 16, with which the unit can be activated when desired. A green LED 17 is configured to light when the unit is active and the battery holds a sufficient charge for proper operation. The circuit for activating the LED 17 to operate at the proper time and under the proper conditions is described more fully hereinbelow.

At the upper end of the central body portion is an array of LED's 18 comprising ten independently actuatable LED's arranged in a bar graph configuration. Indicia 19 are appropriately aligned with the various LED's to indicate a detected voltage level as described more fully below.

Imbedded within the insulated probe tip 14 is a small conducting strip 21. The strip 21 is bent in the shape of a horseshoe and preferably is made of brass with a size of about one-half inch by two inches. The horseshoe shape of the strip 21 ensures that a portion of the strip will be located at about the same distance from a conductor to be tested no matter how the probe tip 14 is positioned against the conductor. It is preferable that the detector 11 be sized and configured to be carried easily by an electrical utility worker to lineman and can be carried in a holster or pouch secured to the lineman's belt.

In use, the detector 11 is held in a hand and the activator switch 16 is depressed to activate the circuitry. The probe tip 14 is then placed on a conducting surface that is desired to be tested for dangerous foreign voltages. As described in detail below, the internal circuitry of the device then detects any charge induced on the strip 21 by the presence of alternating voltage on the conductor. This detected charge is then converted to a DC signal proportional to the magnitude of the voltage on the conductor. The DC signal is then displayed on the LED bar graph 18 as an indication of the RMS magnitude of a voltage, if any, on the conductor.

Figure 2:
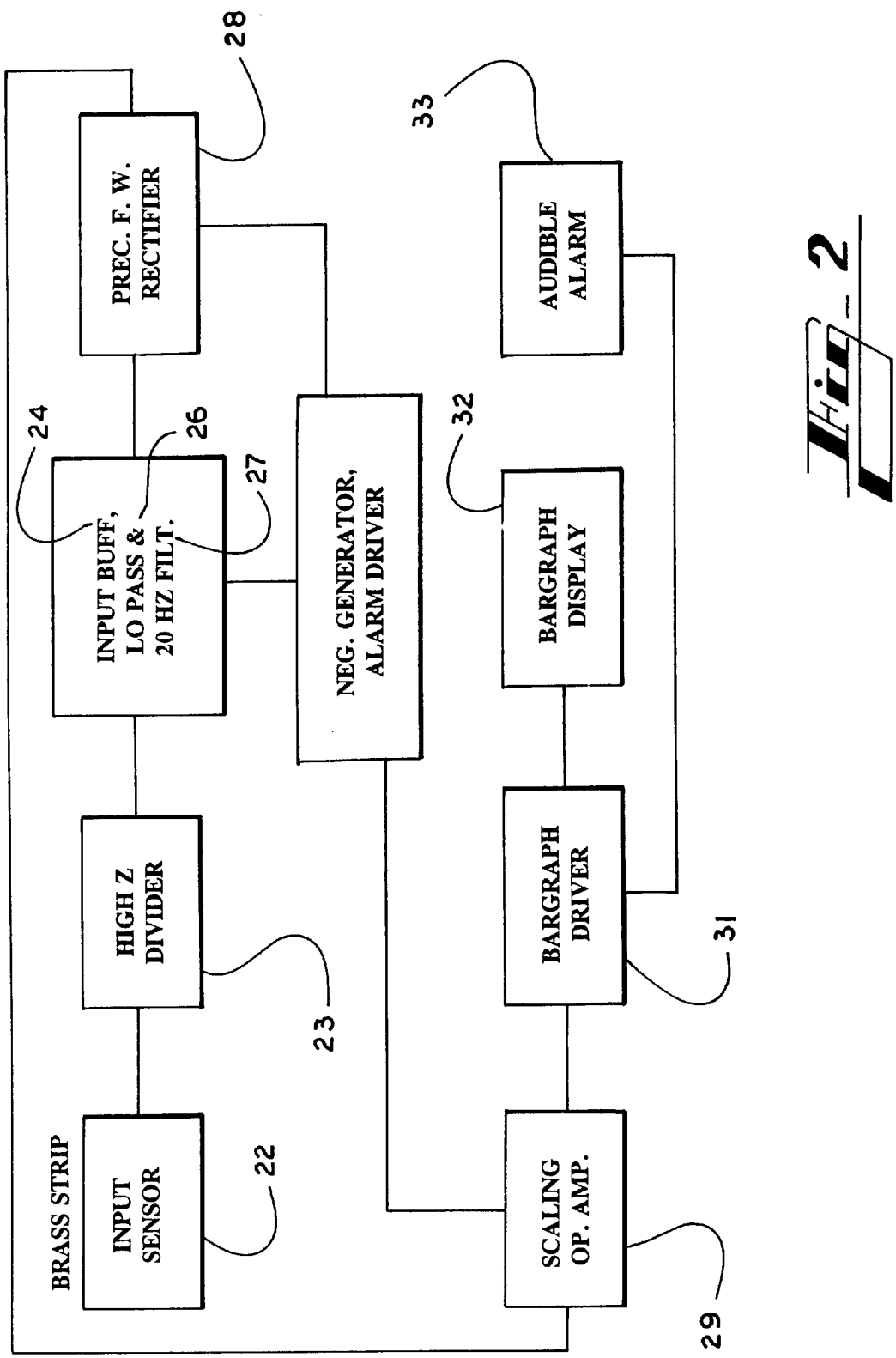
FIG. 2 is a functional block diagram indicating the various functions performed by the present invention to achieve its unique results.

FIG. 2 is a functional block diagram illustrating how a charge on the brass strip 21 is processed and displayed on the LED bar graph display. When the input sensor or brass strip 22 is placed adjacent to a conductor that carries an AC voltage, the strip becomes capacitively coupled to the conductor. That is, the strip forms one plate of the capacitor while the conductor itself forms the other plate. Since the conductor and brass strip are spaced by at least the distance between the strip and the exterior of the probe tip, a charge is induced through capacitive coupling in the brass strip input sensor 22.

The input sensor 22 is coupled through a high impedance voltage divider 23 to an input buffer 24, a low pass filter 26, and a 20 hertz notch filter 27. The high impedance voltage divider 23 ensures that the components comprising the buffer and filters are not overdriven by a charge induced on the brass strip input sensor 22. The input buffer 24 preferably is an operational amplifier configured as a voltage follower to exhibit a gain of one to one. This forms a charge amplifier, converting the sensed charge level on the brass strip input sensor 22 to a corresponding analog voltage. The analog voltage is then passed through a low pass filter to remove components attributable to voltages having frequencies above about 200 hertz. These components can be due to a variety of sources including radio signals from nearby transmission towers and, although harmless, can corrupt a measurement or produce a false reading if not removed. The 20 hertz notch filter removes a small band of the remaining voltage range that centers on 20 hertz. 20 hertz is the common frequency of telephone ringing signals that can be present on conductors and that can also corrupt a measurement or result in a false alarm.

The resulting filtered voltage signal is then directed to a precision full wave rectifier 28, preferably formed of an appropriate array of operational amplifiers. The use of operational amplifiers ensures a more precise conversion of the AC analog voltage to a DC signal without the 1.4 volt offset common with simple diode rectifier bridges. The output of the full wave rectifier is a DC voltage that is proportional in magnitude to the RMS magnitude of the AC voltage present on the conductor that is being tested.

The DC voltage signal from the full wave rectifier is then directed to a scaling amplifier 29 with a gain that can be set with a variable resistor so that the unit can be calibrated to read in appropriate units. The scaled DC signal is directed to a bar graph driver 31 that is designed to light an LED bar graph display according to the magnitude of the DC input signal. The output of the bar graph driver 31 is coupled to an LED bar graph display 32. The level of the DC input signal to the bar graph driver is indicated by the number of LED's that are lit in the bar graph display. Preferably, the system is calibrated by the scaling amplifier so that each successive LED of the bar graph display represents 50 volts RMS present on the conductor being tested. Thus, with a ten element bar graph display, a total detected voltage of 500 volts RMS can be displayed.

Finally, an audible alarm 33 preferably is coupled to the first LED of the bar graph display so that the audible alarm sounds when 50 volts or more is detected on the conductor being tested. This provides the user with an audible indication that there possibly exists dangerous voltages on the conductor and that caution should be observed.

FIG. 3 is a detailed circuit diagram illustrating a preferred electronic circuit for carrying out the method of the present invention. The circuit 41 includes the horseshoe shaped brass strip 21 discussed briefly with respect to FIG. 1. When brought adjacent to a conductor carrying an AC voltage, a corresponding AC charge is induced on the brass strip 21 through capacitive coupling. Since the voltage on the conductor is time varying in nature, the charge induced on the strip 21 will be a corresponding time varying charge. The strip 21 is coupled through four resistors, R1, R2, R3, and R4, to the positive input of operational amplifier 42. Each of the resistors is a 22 MΩ resistor. These resistors form a very high impedance 5 to 1 voltage divider for the input of op-amp 42 to avoid overdriving the input of the op-amp. Zener diodes D1 and D2 are ten volt zener diodes coupled from the input of op-amp 42 to ground to protect op-amp 42 in case of exposure to extremely high voltages.

Op-amp 42, which preferably is one-half of a dual op-amp integrated circuit designated MC33182, is a dual J-fet input operational amplifier and is configured as a voltage follower with unity gain. In this configuration, op-amp 42 forms a charge amplifier, which converts the sensed charge on the strip 21 to a corresponding analog voltage signal at the output of the op-amp. Since the charge on the strip 21 is a time varying charge corresponding in frequency to the frequency of the voltage on the conductor being tested, the analog voltage signal at the output of op-amp 42 is also a time varying voltage.

The output of operational amplifier 42 is presented to a low pass filter formed by capacitor 43 and inductor 44. This is a classic LC filter and the values of the components are chosen so that preferably the filter removes from the analog voltage components having frequencies above about 200 hertz. It has been found that a 56 mH. and a 10 $\mu$F form a low pass filter with these characteristics. A 200 hertz roll-off point is selected for the low pass filter because it provides a high degree of immunity to external interfering signals, such as radio station transmitters, while passing commercial power frequency signals (60 hertz) and their first and second harmonics unaltered.

From the low pass filter, the analog voltage is presented to a twin-T notch filter 46 formed from resistors R6, R7, R8, and R9 and capacitors C3, C4, C5, and C6. The notch filter circuit shown in FIG. 3 is a classic resistive capacitive notch filter used in many applications. It should be understood, however, that other notch filter circuits can be substituted for the twin-T filter configuration of notch filter 46 with comparable results. With the values of the resistors selected to be 820 KΩ and the values of the capacitors selected to be 0.01 $\mu$F., the notch filter 46 functions to filter from the analog signal a narrow relatively sharp band component having a frequency centered at 20 hertz. The purpose of the filter is to remove from the detected voltage any components that result from telephone ringing signals that may be present on nearby telecommunications lines or on the tested conductor itself. By far, the predominant ringing signal used in the telecommunications industry is a 20 hertz sign wave signal at approximately 85 to 105 volts RMS. While these signals are relatively harmless, they nevertheless could, if detected by the present invention, indicate a false reading or otherwise corrupt the measurement being made.

After having passed the low pass filter and the twin T notch filter 46, the remaining analog voltage signal will correspond and be proportional to alternating voltages on the conductor having a frequency range of 0 to 200 hertz without any component at 20 hertz. This filtered signal is then presented to operational amplifier 47, which is the other half of the dual J-fet input operational amplifier MC33182. This operational amplifier is also configured as a voltage follower so that its gain is unity.

The output of op-amp 47 is appropriately directed through a resistor array 48 to the input of a precision full wave rectifier formed by op-amps 49, 51, and 52. The resistor array in the preferred embodiment comprises component number CTS7/27K and each of the resistors in the array is a 27 KΩ resistor. These resistors are used to set the gain of the four operational amplifiers 49, 51, 52, and 53. Preferably, these amplifiers are all part of a quad op-amp integrated circuit. In the preferred embodiment, this circuit was selected to be component No. MC33184.

As mentioned earlier, op-amps 49, 51, and 52 are connected with diodes D3, D4, D5, and D6 to form a full wave precision rectifier. The advantage of such an integrated circuit based rectifier is that it is more precise than simple diode bridge rectifiers and avoids the 1.4 volt offset that would be present with a rectifier formed from diodes. The output of the rectifier formed by op-amps 49, 51, and 52 is a rectified signal corresponding to the input analog voltage signal. This rectified signal is filter by capacitor C10 to result in a pure DC signal that is proportional in magnitude to the RMS value of the analog voltage signal input to the rectifier and thus proportional to potentially dangerous voltage potentials on the tested conductor.

The DC signal from the rectifier and capacitor is applied to the input of operational amplifier 53. In the preferred embodiment, this op-amp is the fourth op-amp in the quad op-amp integrated circuit MC33184. Variable resistor R11 is used to set the gain of op-amp 53. With this configuration, op-amp 53 becomes a scaling amplifier allowing factor calibration of the circuit so that appropriate voltage levels are indicated upon detection.

The output of op-amp 53 is applied through resistor R16 to the input of an LED bar graph driver 54. In the preferred embodiment, bar graph driver 54 is selected to be component No. LM3914, which is a complete driving circuit for a ten LED bar graph. The driver 54 is designed to activate in sequence a series of ten LED's as the input signal to the driver rises from 0 to a predetermined maximum value. The driver 54 drives a ten segment LED bar graph display 56 through resistor arrays 57 and 58, which provide current limiting for the bar graph LED's and IC4. Thus, the number of LED's lit by the driver 54 indicates the level of DC signal applied to the driver. In the preferred embodiment, the scaling amplifier 53 is calibrated so that each LED in the bar graph display corresponds to a 50 volt RMS voltage on the conductor being tested. Thus, the full range of detected voltage with the preferred embodiment is about 500 volts.

The first LED driver output of driver 54 is also coupled through transistor Q1 to a buzzer BU1. Thus, when the first LED is lit, a buzzer is also activated to give the user an audible indication of the presence of a voltage on the test conductor.

The op-amps in this preferred embodiment require both positive and negative power. In order to use a single battery, the negative supply must be derived. IC timer 59 provides this function as well as providing an audible frequency to drive the buzzer BU1. The frequency of IC timer 59 is set to 2,800 hertz to give a particularly noticeable warning tone when the buzzer is activated. This frequency is also easy to rectify and filter with capacitors C8 and C9 and diodes D8 and D9 to derive the negative supply required to drive the operational amplifiers in this circuit.

As mentioned above, transistor Q1 functions as a switch that is driven by the lowest level detected by the bar graph driver 54. When activated, Q1 applies full battery potential to one side of the buzzer BU1. The other side of the buzzer is switched to the battery common at the 2,800 hertz rate. This combination results in a rather loud and obnoxious tone that is difficult to ignore.

Diode D7 is a green LED that functions as a power indicator. It receives power through diode D10 and resistor R12. D10 is a 6.2 volt zener diode. Adding this to the 1.4 volts required to illuminate D7, the battery must be above 7.6 volts to illuminate D7. D7 therefore serves as both a power on indicator and a low battery warning.

Capacitor C1 is placed directly across the switched battery to provide filtering. This capacitor is necessary to remove unwanted signals such as the 2,800 hertz signal generated by the integrated circuit timer 59 that could be conducted between circuits on the power supply leads.

With the just described circuit, it will be seen that as the strip 21 is brought into the vicinity of a conductor to be tested, an alternating charge is induced on the strip if an alternating voltage is present on the conductor. This charge is subjected to a low pass filter and a notch filter, which remove frequency components above 200 hertz and at 20 hertz, respectively. This removes from the signal unwanted components that could cause false alarms or degraded accuracy. The filtered signal is then rectified with a precision full wave rectifier and converted to DC. The DC signal is scaled to match the range of the LED bar graph driver and is applied to the driver. The driver, then, lights the appropriate number of LED's in the bar graph to indicate the level of the input signal. Accordingly, when the probe is brought in the vicinity of a conductor, the LED bar graph will indicate the approximate amount of potentially dangerous voltage that is present on the conductor. In addition, a buzzer sounds when at least 50 volts is detected on a conductor to provide an audible alarm.

While the circuit of the present invention is not intended to be a precision volt meter, it has been found that maximum errors of only approximately 15% can occur due to uncontrollable factors such as the thickness of insulation surrounding a conductor and the physical size of the conductor itself. Nevertheless, the function of this invention is to provide an early warning to electric utility workmen and telephone linemen that a potentially dangerous voltage is present on a conductor. This function is performed exceptionally well and reliably by the present invention.

This invention has been described in terms of preferred embodiments and methodologies. It will be obvious to those of skill in the art, however, that numerous additions, deletions, and modification might well be made to the illustrated embodiments without departing from the spirit and scope of the invention as set forth in the claims.

We claim:

1. A method of remotely sensing and indicating to a user the presence of a potentially dangerous time varying electrical potential within a frequency range on a conducting test surface while rejecting benign time varying electric potentials having known and finite frequency bounds within the range that would otherwise cause a false alarm, said method comprising the steps of:

(a) locating a conducting probe adjacent to but not in contact with the test surface so that the conducting probe becomes capacitatively coupled to the test surface to induce in the conducting probe a time varying charge proportional in magnitude to and having the frequencies within the frequency range of time varying potentials on the test surface;

(b) converting the time varying charge to a corresponding time varying voltage signal;

(c) removing a first portion of the time varying voltage signal having known frequencies of telephone ringing signals to produce a filtered signal;

(d) rectifying the filtered signal to produce a DC voltage proportional in magnitude to the magnitude of the potentially dangerous time varying electric potential on the test surface; and (e) indicating to a user the magnitude of the DC voltage as a measure of the magnitude of the potentially dangerous time varying electric potential present on the conducting test surface.

2. The method of claim 1 and where in step (a) the probe comprises a conducting plate.

3. The method of claim 1 and wherein step (c) comprises passing the time varying voltage signal through a notch filter.

4. The method of claim 1 and wherein said known frequencies of telephone ringing signals are twenty cycles per second.

5. The method of claim 1 and wherein step (d) comprises passing the filtered signal through a precision full wave rectifier circuit.

6. The method of claim 1 and wherein step (e) comprises indicating the magnitude of the DC voltage on a lighted bar graph meter calibrated in units appropriate to show the magnitude of the time varying electric potential on the conducting test surface.

7. The method of claim 6 and further comprising the step of sounding an audible alarm when the DC voltage exceeds a predetermined threshold.

8. The method of claim 1 and further comprising the step of removing a second portion of the time varying voltage signal having temporal frequencies greater than a predetermined frequency threshold.

9. The method of claim 8 and wherein the predetermined frequency threshold is about two hundred (200) cycles per second.

10. For application to a conducting test surface on which potentially dangerous time varying potentials having a frequency range and benign time varying potentials within finite frequency bounds within the frequency range may be present, a method of detecting and indicating to a user the presence and magnitude of the potentially dangerous potentials while ignoring the benign potentials, said method comprising the steps of:

(a) moving a conducting probe near but not in contact with the conducting test surface to induce in the probe a composite time varying charge proportional to and having the frequency characteristics of potentially dangerous and benign potentials present on the test surface;

(b) converting the composite time varying charge to a corresponding composite time varying voltage signal;

(c) removing from the composite time varying voltage signal components having known frequencies of telephone ringing signals to produce a filtered signal; and (d) indicating to a user the magnitude of the filtered signal as a measure of the magnitude of the potentially dangerous time varying potentials on the conducting test surface.

11. The method of claim 10 and further comprising the step of removing from the composite time varying voltage signal components having frequencies outside the finite frequency bounds and above a predetermined threshold frequency to filter contributions from RF frequency sources.

12. A method of detecting the presence of potentially dangerous time varying potentials on a conducting test surface comprising the steps of:

(a) sensing time varying potentials on the test surface having frequencies with a frequency range;

(b) removing a portion of the sensed potentials for known frequencies of telephone ringing signals; and (c) indicating to a user the presence of remaining sensed potentials as an indication of the presence of potentially dangerous time varying potentials on the test surface.

13. The method of claim 12 and wherein step (a) comprises placing a conducting probe in the vicinity of but not in contact with the conducting test surface to induce in the probe a time varying charge corresponding to time varying potentials on the conducting test surface.

* * * * *